United States Patent
Carcia

(10) Patent No.: US 10,663,532 B2
(45) Date of Patent: May 26, 2020

(54) METHOD OF TESTING CABLE SHIELD PERFORMANCE

(71) Applicant: Hamilton Sundstrand Corporation, Charlotte, NC (US)

(72) Inventor: Francis A. Carcia, Enfield, CT (US)

(73) Assignee: HAMILTON SUNDSTRAND CORPORATION, Charlotte, NC (US)

( * ) Notice: Subject to any disclaimer, the term of this patent is extended or adjusted under 35 U.S.C. 154(b) by 233 days.

(21) Appl. No.: 15/792,491

(22) Filed: Oct. 24, 2017

(65) Prior Publication Data

US 2019/0120889 A1    Apr. 25, 2019

(51) Int. Cl.
*G01R 31/58*     (2020.01)
*G01R 31/12*     (2020.01)
*G01R 31/50*     (2020.01)
G01R 29/08       (2006.01)
G01R 31/00       (2006.01)

(52) U.S. Cl.
CPC ......... *G01R 31/58* (2020.01); *G01R 31/1272* (2013.01); *G01R 31/50* (2020.01); *G01R 29/0835* (2013.01); *G01R 31/008* (2013.01)

(58) Field of Classification Search
CPC  G01R 31/021; G01R 31/026; G01R 31/1278; G01R 31/008; G01R 29/0835; G01R 31/58; G01R 31/50
USPC .......................................... 324/539–544, 612
See application file for complete search history.

(56) References Cited

U.S. PATENT DOCUMENTS

| | | | | |
|---|---|---|---|---|
| 3,781,665 A | * | 12/1973 | Gale | G01R 31/08 324/533 |
| 4,425,542 A | | 1/1984 | Tsaliovich et al. | |
| 4,862,088 A | * | 8/1989 | Etienne | G01L 9/12 324/326 |
| 5,463,317 A | * | 10/1995 | Murphy | G01R 31/021 324/520 |
| 5,570,029 A | * | 10/1996 | Bottman | H04B 3/46 324/628 |
| RE35,561 E | | 7/1997 | Mashikian et al. | |
| 7,608,778 B2 | | 10/2009 | Reykowski | |
| 7,915,898 B1 | | 3/2011 | Kraemer | |
| 8,395,393 B2 | * | 3/2013 | Betz | G01R 31/021 324/539 |
| 2004/0066202 A1 | * | 4/2004 | Pereira | G01R 31/021 324/539 |
| 2007/0245182 A1 | * | 10/2007 | Sugiura | G11C 29/16 714/720 |
| 2015/0068278 A1 | * | 3/2015 | Yazawa | G01M 15/104 73/23.32 |

(Continued)

FOREIGN PATENT DOCUMENTS

| | | |
|---|---|---|
| JP | 2008046038 A | 2/2008 |
| WO | 9600907 A1 | 1/1996 |
| WO | 2017009225 A1 | 1/2017 |

*Primary Examiner* — Jeff W Natalini
(74) *Attorney, Agent, or Firm* — Carlson, Gaskey & Olds, P.C.

(57) ABSTRACT

An example method of testing a shielded cable couples an excitation signal to the shielded cable at an end of a shielded cable, determines one or more resonant frequencies of the shielded cable based on a response of the shielded cable to the excitation signal, and determines that a shielding of the shielded cable has degraded based on a change in the one or more resonant frequencies. A system for testing a shielded cable is also disclosed.

15 Claims, 4 Drawing Sheets

(56) References Cited

U.S. PATENT DOCUMENTS

2015/0316599 A1* 11/2015 Weindl .................. G01R 31/11
324/543

* cited by examiner

METHOD OF TESTING CABLE SHIELD PERFORMANCE

BACKGROUND

The present disclosure relates to shielded cables, and more particularly to determining whether the shielding of a shielded cable has degraded.

Shielded cables are commonly used for transmitting power and data between components. In a shielded cable, individual conductors are enclosed within a common sheath, and each of those individual conductors can be shielded from one another to maximize electrical isolation and minimize cross-talk between the conductors. In some examples this takes the form of twisted pairs, where individual pairs of conductors are twisted around each other within the common sheath. Use of twisted pairs can minimize electromagnetic interference (EMI) from external sources, for example.

A known method of testing the integrity of the shielded cable involves inducing radio frequency (RF) currents on a given shielded cable, and measuring a coupled voltage on a shielded center conductor to determine the shield transfer impedance. This method can be difficult to implement in aircraft environments, where cables may be situated in tight spaces and/or are generally difficult to access.

SUMMARY

An example method of testing a shielded cable couples an excitation signal to the shielded cable at an end of a shielded cable, determines one or more resonant frequencies of the shielded cable based on a response of the shielded cable to the excitation signal, and determines that a shielding of the shielded cable has degraded based on a change in the one or more resonant frequencies.

A system for testing a shielded cable is also disclosed.

The embodiments, examples, and alternatives of the preceding paragraphs, the claims, or the following description and drawings, including any of their various aspects or respective individual features, may be taken independently or in any combination. Features described in connection with one embodiment are applicable to all embodiments, unless such features are incompatible.

DETAILED DESCRIPTION

Figure 1:
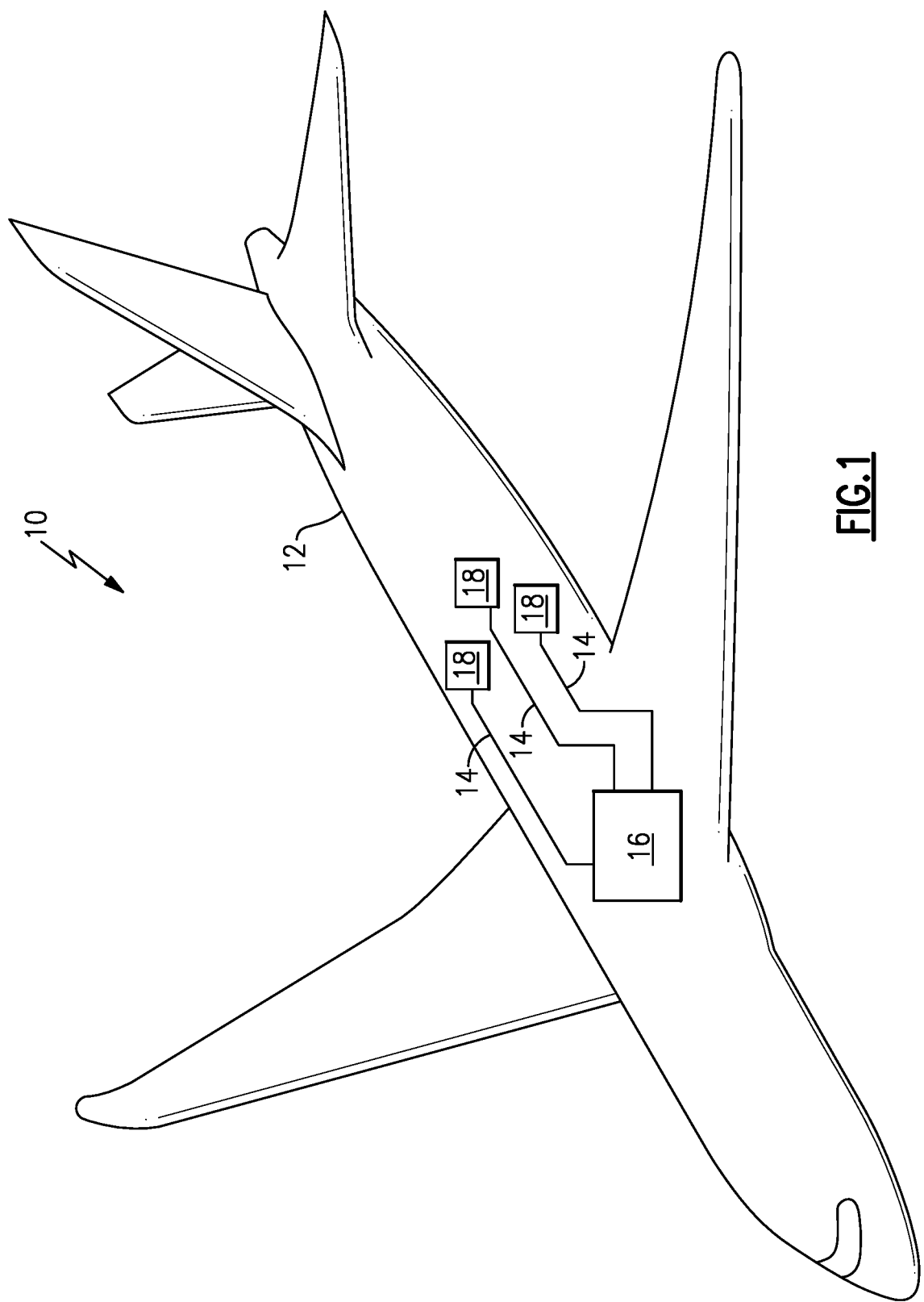
FIG. 1 schematically illustrates an aircraft incorporating a plurality of shielded cables.

FIG. 1 schematically illustrates an aircraft 12 that includes a plurality of shielded cables 14. In the example of FIG. 1, the shielded cables 14 connect a component 16 to a plurality of discrete components 18. The shielded cables 14 may be used for power and/or communication signals, for example. In one example the component 16 is a master controller, and the plurality of discrete components 18 are sensors.

Figure 2:
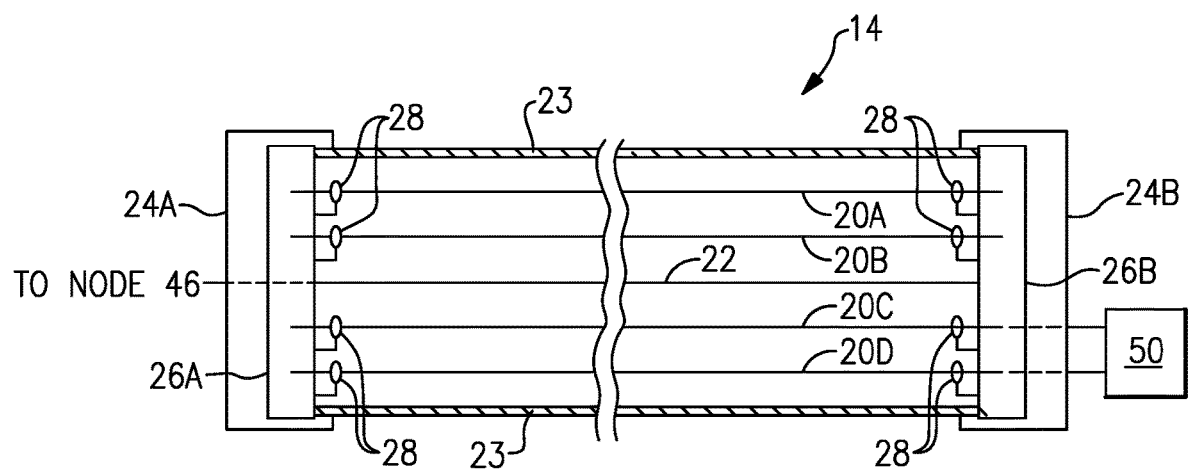
FIG. 2 schematically illustrates an example shielded cable.

FIG. 2 schematically illustrates an example shielded cable 14 that includes a plurality of individual conductors 20, 22 enclosed within a common sheath 23. In one example, the conductor 22 is designated as an excitation conductor for conducting testing on the shielded cable 14, and the remaining conductors 20A-20D are used for standard cable operations and are not reserved for an excitation signal. In the same or another example, the conductors 20 are individually shielded and the conductor 22 is not individually shielded.

The shielded cable 14 interfaces to connector 24A at one end of the shielded cable 14, and to connector 24B at an opposite end of the shielded cable 14. Each connector 24A-B has a respective backshell 26A-B. The connectors 24 are used to connect to other components, such as items 16 and 18 in FIG. 1. The backshells 26 shield pins of the conductors 20. As used herein, a pin is the terminal portion of a conductor 20. Thus, cable shields at a first end of each conductor 20, 22 (shown schematically as 28) terminate at backshell 26A, and cable shields at an opposite second end of each conductor 20, 22 (also shown schematically as 28) terminate at backshell 26B.

Figure 3:
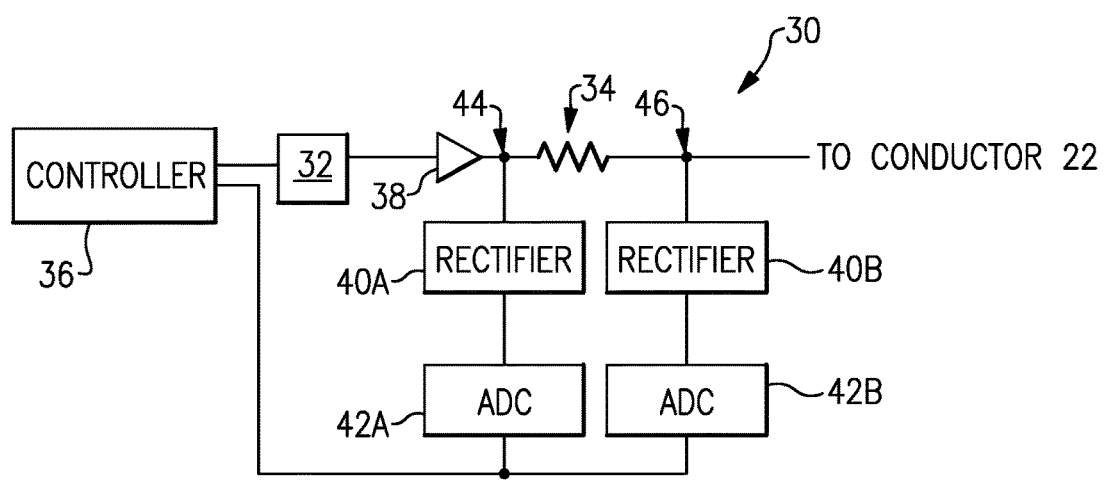
FIG. 3 schematically illustrates a test circuit for testing the integrity of a shielded cable.

FIG. 3 schematically illustrates a testing circuit 30 operable to determine whether the shielding of one or more conductors 20 of the shielded cable 14 have degraded based on a change in the resonant frequencies of the shielded cable 14. Shielded cables have resonant frequencies based on a number of factors, such as cable length, conductor quantity, conductor arrangement, conductor shielding, and conductor termination. Additionally, it is expected that no two cables are exactly alike with respect to their resonant frequencies, due to slight manufacturing variations. Rather, because of even subtle differences between cable manufacture, each cable has a unique set of resonant frequencies.

If the shielding of one or more of the conductors 20 degraded and became an open shield, different resonant frequencies would be produced as compared to a properly terminated shield. This could include development of new resonances, or a shift in existing resonances, for example. The testing circuit 30 is operable to detect such changes in resonant frequencies of the shielded cable 14.

The testing circuit 30 includes a signal source 32 that couples an excitation signal to the excitation conductor 22 at a plurality of different frequencies. The excitation conductor 22 connects to the testing circuit 30 at node 46 and passes the AC current of the excitation signal down its length with a return path being primarily or all parasitic coupling to the shields of the conductors 20 in the shielded cable 14 bundle (e.g., back through a chassis ground). In one example, the end of excitation conductor 22 proximate to backshell 26B is terminated to an unused portion of the connector 24B, terminated with a resistance, or left unterminated.

In one example the signal source 32 is a direct digital synthesizer (DDS) integrated circuit that can produce a wide range of frequencies with a fine resolution. The test frequency range could be based on cable length and/or complexity, for example. Some DDS units can cover the whole bulk cable conducted susceptibility test frequency range of 10 kHz to 400 MHz, for example, and can also modulate their output to duplicate AM modulation.

In one example, the excitation signal varies its frequency while maintaining an electrical current value that is substantially the same over the frequency range. In one example, the signal source 32 performs a signal sweep over the frequency range to provide the excitation signal at the plurality of frequencies.

The test frequency range used for determining the resonant frequencies can be based on the length and relative complexity of the shielded cable 14. Thus, different test frequency ranges can be used for different shielded cables 14.

At each discrete frequency, the excitation signal has a given expected value (e.g., a current magnitude being output by the signal source 32). A controller 36 of the testing circuit 30 measures the excitation signal across a circuit element 34 to determine if a measured value of the excitation signal at a given frequency differs from its expected value by more than a predefined difference threshold. If such a difference is present, that frequency constitutes a resonant frequency of the shielded cable 14. As used herein, a "resonant frequency" is a frequency where cable excitation current peaks to a high value (series resonant) or drops to a low value (parallel resonance). If the excitation signal is provided at a natural frequency of the shielded cable 14, a load characteristic of the excitation conductor 22 will change (e.g., draw more or less current) over a small frequency range.

The testing circuit 30 could be grounded to a vehicle chassis, for example. Alternatively, an alternating current (AC) coupling could be used to ground the testing circuit 30.

By designating a conductor 22 as an excitation conductor to act as a tightly coupled signal source, the need to externally induce AC currents on the shielded cable 14 (i.e., at locations intermediate of the cable ends) is eliminated. As a result, this method of testing a cable can be conveniently performed on cables that are already deployed, even in tight and/or hard to reach locations for which the prior art technique of inducing RF currents to determine a shield transfer impedance would not be suitable.

The excitation signal output by the signal source 32 is amplified by an amplifier 38. The amplifier 38 amplifies the excitation signal (e.g., broadband amplification) to a level high enough to excite the excitation conductor 22. The output of the amplifier 38 is passed through a circuit element 34 to establish a source impedance through the node 46 to conductor 22 of shielded cable FIG. 2.

The circuit element 34 could be a resistor, or an attenuator, for example. Alternatively, a directional coupler could be used, which may provide more isolation and potentially a better resolution than a resistor or attenuator.

In one example, a monitoring device is used in conjunction with the circuit element 34 that could be controlled with a digital signal processor (DSP) or CPU and that uses software defined radio techniques to perform network analyzer functions with the addition of an impedance bridge (not shown). Such an arrangement could yield additional data, such as phase information, of the excitation signal.

The controller 36 commands the frequency of signal source 32 and then measures the current across the circuit element 34 using a pair of rectifiers 40A-B whose respective outputs are passed through respective analog-to-digital converters (ADCs) 42A-B. In one example, the rectifiers 40A-B are precision rectifiers, which in some cases have a better dynamic range and precision than conventional rectifiers. Another option would be to use a respective broadband logarithmic amplifier in place of each rectifier 40A-B, which could also provide a high degree of precision compared to diode rectification. The controller 36 processes the digital output of each ADC converter 42, to determine the value of the excitation signal across the circuit element 34.

In the testing circuit 30, node 44 is connected to the output of amplifier 38, the input of rectifier 40A, and one side of the circuit element 34. Node 46 is connected to an input of rectifier 40B, an opposite side of the connective circuit element 34, and to the excitation connector 22.

In the example depicted in FIG. 2, the shielded cable 14 connects to only a single excitation conductor 22. In one testing configuration, the test circuit 30 is electrically coupled to the conductors 20A-D, and is only connected to the single excitation conductor 22 by the shielded cable 14, as shown in FIG. 3.

Figure 4:
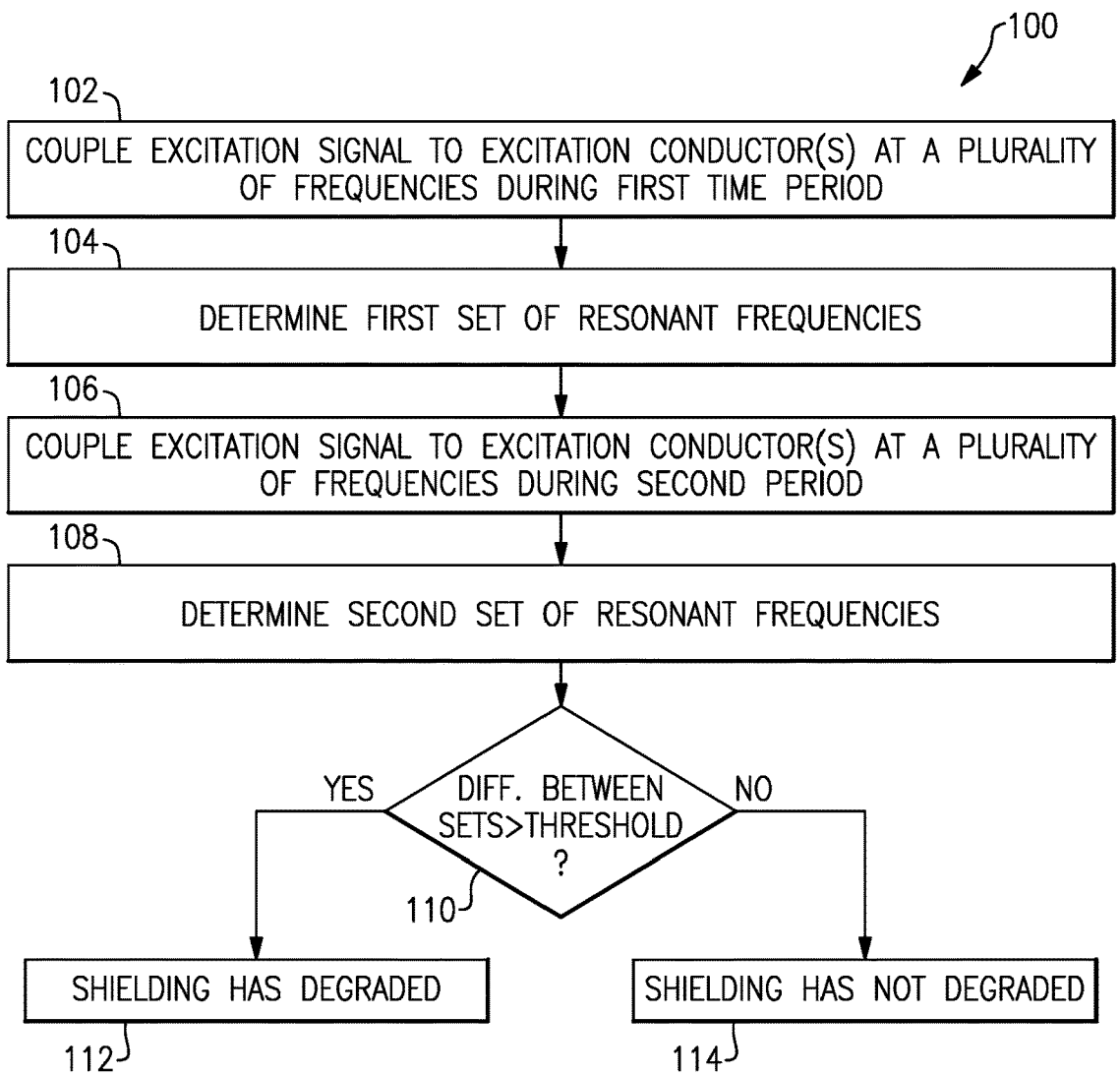
FIG. 4 is a flowchart of an example method for testing the integrity of a shielded cable.

FIG. 4 is a flowchart 100 of an example method for testing the integrity of a shielded cable. The signal source 32 couples the excitation signal to one or more excitation conductors 22 at a plurality of different frequencies during a first time period (block 102), and controller 36 measures the excitation signal across the circuit element 34 at each frequency, and determines a first set of resonant frequencies for the shielded cable 14 during the first time period (block 104). In one example, the first time period corresponds to a time before the shielded cable 14 is installed in a system (e.g., an aircraft). This first set of resonant frequencies serves as a baseline for comparison of future detected resonant frequencies.

During a second time period, the signal source 32 again couples the excitation signal to the excitation conductor 22 at a plurality of different frequencies (block 106), and the controller 36 determines which of those excitation signals correspond to resonant frequencies of the shielded cable 14 (block 108).

The controller 36 compares the first and second set of resonant frequencies (block 110), and if the resonant frequencies differ by more than a predefined threshold, the controller 36 determines that a shielding of the shielded cable 14 has degraded (block 112) (e.g., an individual shielding of one of the non-excitation conductors 20). Otherwise, if the resonant frequencies are the same or only differ by less than the threshold, the controller 36 determines that the shielding of the shielded cable 14 has not degraded (block 114). In one example, an extent of the degradation can be inferred from how great the difference is between the first and second set of resonant frequencies.

The threshold used in block 110 could be defined in different ways. In one example, to "differ by more than a predefined threshold," a single resonant frequency must have either appeared, disappeared, or been adjusted by more than a predefined amount. In another example, a percentage of the resonant frequencies that has changed must exceed a predefined amount. Of course, the threshold could be defined in other ways as well.

Additional sets of resonant frequencies could be periodically determined to further test the integrity of the shielded cable 14. In one example, the controller 36 is configured to perform the method of FIG. 4 as a built-in self-test, such as during vehicle startup.

Although a shielded cable 14 with only five conductors has been discussed in connection with FIG. 2 (e.g., including the individually shielded non-excitation conductors 20 and non-individually shielded excitation conductor 20), it is understood that the techniques discussed herein could be applied to different shielded cables that have different quantities of conductors, with the same or different allocations of which conductors are excitation conductors and which are not. For example, if shielded cable had a larger quantity of conductors (e.g., 20 or more) it may be desirable to have multiple excitation conductors in that shielded cable.

Figure 5:
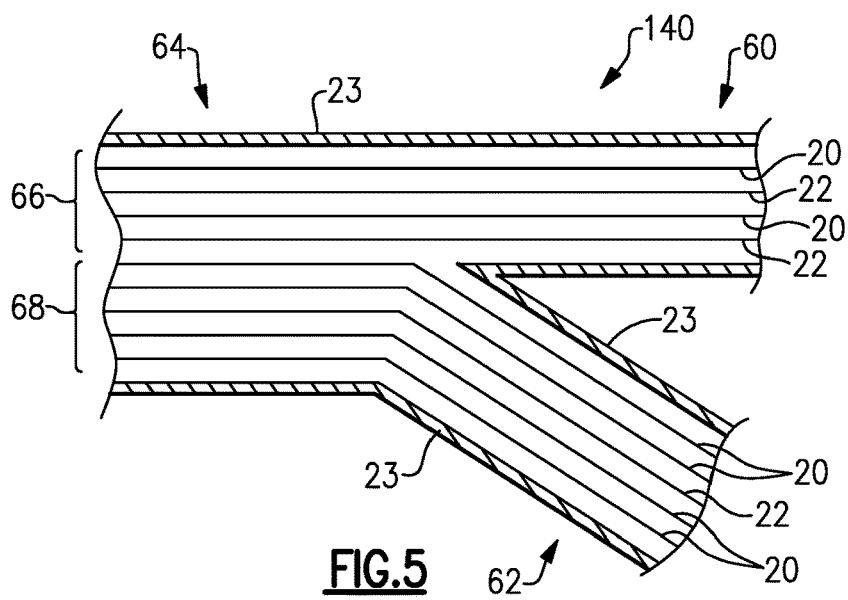
FIG. 5 schematically illustrates an example branched shielded cable.

Also, if a shielded cable 14 has multiple branches, the shielded cable may include multiple excitation conductors, including at least one for each branch. FIG. 5 schematically illustrates an example branched shielded cable 140 that includes two branches 60, 62 that merge in a combined portion 64. The combined portion 64 includes a first group of conductors 66 corresponding to the first branch 60, and a second group of conductors 68 corresponding to the second branch 62. Each group 66, 68 includes at least one excitation conductor 22 and at least one additional, non-excitation conductor 20.

Referring again to FIG. 2, in one configuration, the conductors 20A-D are instead configured as excitation conductors, and conductor 22 is configured as an excitation monitor. In this example, the test circuit 30 couples the excitation signal to some or all of the individual shielded conductors 20 and the test circuit 30 measures a return signal on the excitation monitor conductor. In one example, the excitation signal is coupled to the plurality of excitation conductors in serial order, so that a respective set of resonant frequencies is determined for each conductor 20 during the first and second time periods for comparison. The same excitation scheme could be used for a branched shielded cable, such as the one shown in FIG. 5.

Figure 6:
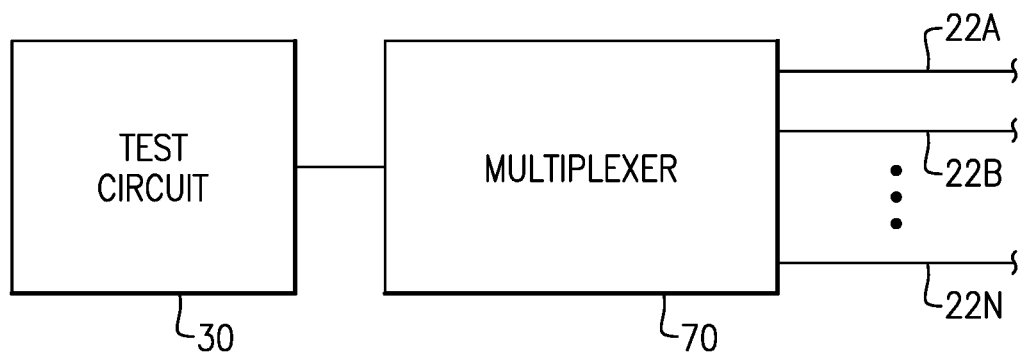
FIG. 6 schematically illustrates a configuration for sharing a single test circuit among a plurality of shielded cables.

In one example, shown in FIG. 6, a single testing circuit 30 is shared between a plurality of excitation conductors 22A-N corresponding to a plurality of shielded cables 14 through a multiplexer 70 that selectively connects the testing circuit 30 to respective ones of the excitation conductors 22 of whichever one of the plurality of shielded cables 14 is under test. System interlocks could be used to prevent the excitation signal from interfering with normal system operation (e.g., only performing testing while an aircraft is on the ground and stationary).

Some aircraft circuits use an aircraft chassis as ground. If one of the connectors 20, 22 utilizes such a ground connection, two dissimilar metals may contact each other. If corrosion occurred between those two metals, for example, electrical performance of a shielded cable could be affected in the form of lower currents over broad frequency ranges. In one example, the controller 36 is configured to determine that a ground connection between the shielded cable 14 (interfaced to excitation conductor 22) and a vehicle chassis has degraded based on every measurement of the excitation signal (or a majority of the measurements) being lower than their expected value.

Another way to detect degradation of shielding of one of the conductors 20 of the shielded cable 14 is using a sensor that utilizes one or more conductors of that shielded cable, and provide an interference source to test low level signals to determine if isolation is degraded by shield changes. In FIG. 2, for example, a sensor 50 uses conductors 20C-D. The sensor 50 may be used as the sensor 18 in FIG. 1, for example.

In one example, the controller 36 attempts to induce cross-talk interference on the conductors 20C-D by producing a signal that uses one or more predefined operating frequencies. If the shielded cable 14 of FIG. 2 was fully shielded, the sensor 50 should not experience any increase in signal interference. However, if the shielding had degraded, the sensor 50 would likely see additional interference on the conductors 20C-D. In one example, the controller 36 uses the amount of interference experienced by the sensor 50 as an indicator of shielding degradation. The sensor 50 could be a pressure sensor, temperature sensor, speed sensor, or position sensor (e.g., a linear voltage differential transducer "LVDT"), for example.

Although not shown in FIGS. 2 and 5, it is understood that the various conductors could be arranged in twisted pairs.

Although example embodiments have been disclosed, a worker of ordinary skill in this art would recognize that certain modifications would come within the scope of this disclosure. For that reason, the following claims should be studied to determine the scope and content of this disclosure.

What is claimed is:

1. A method of testing a shielded cable, comprising:
providing an excitation signal from a test circuit to a plurality of excitation conductors of a shielded cable at a plurality of different frequencies at an end of the shielded cable, the excitation signal having an expected value at each frequency, wherein the plurality of excitation conductors are shielded from one another, and wherein the shielded cable also includes a monitoring conductor that is separate from the plurality of excitation conductors;
determining one or more resonant frequencies of the shielded cable based on a response of the shielded cable to the excitation signal, said determining comprising:
measuring the excitation signal on the monitoring conductor at each frequency from the test circuit; and
determining that a given frequency constitutes a resonant frequency of the shielded cable if the measured value of the excitation signal at the given frequency differs from the expected value of the excitation signal at the given frequency by more than a predefined difference threshold; and
determining that a shielding of the shielded cable has degraded based on a change in the one or more resonant frequencies.

2. The method of claim 1, comprising:
determining a first set of resonant frequencies of the shielded cable at a first time;
determining a second set of resonant frequencies of the shielded cable at a second time; and
comparing the first set of resonant frequencies to the second set of resonant frequencies;
wherein said determining that a shielding of the shielded cable has degraded based on a change in the one or more resonant frequencies of the shielded cable is performed based on said comparing indicating a difference between the first and second sets of resonant frequencies.

3. The method of claim 1, wherein said providing the excitation signal to the shielded cable at a plurality of different frequencies comprises performing a frequency sweep across a frequency band.

4. The method of claim 1, comprising:
determining that the shielding of the shielded cable has degraded based on a change in interference experienced by a sensor that utilizes a conductor of the shielded cable that is separate from the plurality of excitation conductors.

5. The method of claim 1, wherein said providing an excitation signal to the plurality of excitation conductors comprises providing the excitation signal to different ones of the plurality of excitation conductors at different times, such that resonant frequencies are separately determined for the different ones of the plurality of excitation conductors.

6. The method of claim 1, wherein said determining that a given frequency constitutes a resonant frequency of the shielded cable comprises:
determining that the given frequency constitutes a series resonance if the measured value is greater than the expected value at the given frequency; and determining that the given frequency constitutes a parallel resonance if the measured value is lower than the expected value at the given frequency.

7. The method of claim 1, wherein the shielded cable comprises a respective connector at each of its ends, the method comprising:
   determining that a ground connection between the shielded cable and a vehicle chassis has degraded based on a majority of the measurements of the excitation signal being lower than its expected value.

8. The method of claim 1, wherein the monitoring conductor lacks an individual shield within the shielded cable.

9. A system for testing a shielded cable, comprising:
   a shielded cable comprising a plurality of conductors, including a plurality of excitation conductors that are shielded from one another and a monitoring conductor; and
   a test circuit comprising:
      a signal source operable to couple an excitation signal to the plurality of excitation conductors of the shielded cable at a plurality of different frequencies at an end of the shielded cable, wherein the excitation signal has an expected value at each frequency; and
      a controller configured to:
         measure the excitation signal across a circuit element of the monitoring conductor at each frequency from the test circuit;
         determine that a given frequency constitutes a resonant frequency of the shielded cable if the measured value of the excitation signal at the given frequency differs from the expected value of the excitation signal at the given frequency by more than a predefined difference threshold; and
         determine that a shielding of the shielded cable has degraded based on a change in the one or more resonant frequencies.

10. The system of claim 9, wherein the controller is configured to:
   determine a first set of resonant frequencies of the shielded cable at a first time;
   determine a second set of resonant frequencies of the shielded cable at a second time; and
   compare the first set of resonant frequencies to the second set of resonant frequencies;
   wherein the determination that the shielding of the shielded cable has degraded based on a change in the one or more resonant frequencies of the shielded cable is performed based on the comparison indicating a difference between the first and second sets of resonant frequencies.

11. The system of claim 9, wherein the circuit element comprises a resistor, an attenuator, or a directional coupler.

12. The system of claim 9, wherein to provide the excitation signal to the shielded cable at a plurality of different frequencies, the signal source is operable to perform a frequency sweep across a frequency band.

13. The system of claim 12, wherein the test circuit is connected to a single end of the shielded cable.

14. The system of claim 12, comprising:
   a sensor that utilizes the monitoring conductor;
   wherein the controller is further configured to determine that the shielding of one or more of the plurality of excitation conductors has degraded based on a change in interference experienced by a conductor of the shielded cable that is separate from the plurality of excitation conductors.

15. The system of claim 12, wherein the monitoring conductor lacks an individual shield within the shielded cable.

* * * * *